United States Patent
Ha et al.

(10) Patent No.: US 7,203,388 B2
(45) Date of Patent: Apr. 10, 2007

(54) PRINTED CIRCUIT BOARD INCLUDING WAVEGUIDE AND METHOD OF PRODUCING THE SAME

(75) Inventors: Sang-Won Ha, Daejeon (KR); Byoung-Ho Rhee, Daejeon (KR); Keun-Ho Kim, Daejeon (KR); Kyoung-Up Shin, Chungcheongbuk-do (KR); Dek-Gin Yang, Chungcheongbuk-do (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 0 days.

(21) Appl. No.: 10/846,450

(22) Filed: May 14, 2004

(65) Prior Publication Data

US 2005/0094922 A1     May 5, 2005

(30) Foreign Application Priority Data

Oct. 29, 2003   (KR) .............. 10-2003-0076043

(51) Int. Cl.
  *G02B 6/12* (2006.01)
  *H01R 12/00* (2006.01)
(52) U.S. Cl. ............... 385/14; 385/129; 439/55; 439/78
(58) Field of Classification Search ............... None
  See application file for complete search history.

(56) References Cited

U.S. PATENT DOCUMENTS

| | | | |
|---|---|---|---|
| 6,760,497 B1 * | 7/2004 | Straub | 385/14 |
| 6,834,131 B2 * | 12/2004 | Tourne | 385/14 |
| 6,996,305 B2 * | 2/2006 | Kim et al. | 385/15 |
| 7,046,870 B2 * | 5/2006 | Kim et al. | 385/14 |
| 2002/0061154 A1 * | 5/2002 | Tsukamoto et al. | 385/14 |
| 2005/0238278 A1 * | 10/2005 | Nakashiba et al. | 385/14 |

FOREIGN PATENT DOCUMENTS

WO   WO98/18301   4/1998

* cited by examiner

*Primary Examiner*—Sung Pak
*Assistant Examiner*—Omar Rojas
(74) *Attorney, Agent, or Firm*—Gottlieb, Rackman & Reisman, P.C.

(57) ABSTRACT

Disclosed is a PCB in which a waveguide is embedded, and a method of producing the same. The PCB includes a substrate, and a lower clad layer formed on the substrate through a predetermined process to allow an optical signal irradiated thereto to be total-reflected thereby. A core layer is formed on the lower clad layer through a predetermined process and exposed using an exposing film on which a waveguide pattern is formed to form the waveguide with a predetermined shape therefrom. Furthermore, an upper clad layer is formed on the core layer through a predetermined process to allow the optical signal irradiated thereto to be total-reflected thereby.

12 Claims, 10 Drawing Sheets

PRINTED CIRCUIT BOARD INCLUDING WAVEGUIDE AND METHOD OF PRODUCING THE SAME

BACKGROUND OF THE INVENTION

1. Field of the Invention

The present invention pertains, in general, to a printed circuit board (PCB) including a waveguide, and a method of producing the same. More particularly, the present invention relates to a PCB in which various shapes of waveguides for a large surface are embedded, and a method of producing the same, in which a core layer cured by UV (UV) and a clad layer are coated on the PCB and the core layer is then exposed using an exposing film on which a waveguide pattern is formed. Additionally, the present invention provides a multi-layered PCB including waveguides embedded therein and a method of producing the same, in which a prepreg is interposed between the waveguide-embedded PCBs to conduct a layup of the PCB and a viahole are then formed and copperplated to electrically connect layers constituting the resulting PCB to each other.

2. Description of the Related Art

Generally, a PCB is used as critical parts of electric and electronic products for connecting electronic parts to each other along a circuit pattern designed on a substrate or supporting the electronic parts, and acts as a passive component widely used in home appliances, communication devices, and industrial devices.

In this regard, a method of producing the PCB includes attaching a thin film made of a predetermined metal such as copper to one side of a phenol resin or an epoxy resin dielectric substrate, etching the thin film (the remaining portion of the thin film except for a linear circuit pattern is etched and removed) to form a predetermined circuit, and forming holes through the thin film to mount parts on the substrate.

The PCB may be classified into a single-sided PCB, a double-sided PCB, and a multi-layered PCB according to the number of sides of the PCB in which the circuit pattern is formed. At this time, the higher the number of layers constituting the PCB is, the higher the number of parts mounted on the PCB is. Thus, the multi-layered PCB may be adopted in high precision electronic products. The single-sided PCB includes a phenol resin as the substrate, and is used in products such as a radio, a telephone, or a simple-structured instrument, in which a circuit pattern is not complicated. Additionally, the double-sided PCB includes an epoxy resin as the substrate, and is applied to electronic products such as a color TV, a VTR, and a facsimile, in which a circuit pattern is relatively complicated. Furthermore, the multi-layered PCB means a print wire substrate in which conductive patterns are formed on three or more layers including a surface conductive layer, and in which the layers are separated from each other by dielectric films positioned between the layers. The multi-layered PCB is applied to high precision devices such as computers with 32 bits or more, electronic switchboards, or high performance communication devices.

Meanwhile, a flexible PCB is used in case that a circuit board must be moved because it is applied to automated devices or camcorders, and the circuit board must be bent when parts are mounted on the circuit board.

Currently, a transmission speed of a signal of an electronic device is considered as an important parameter according to advances in computer and communication technologies, thus the precision alignment of impedances between parts and circuit patterns in a high frequency PCB becomes vital.

The high frequency PCB is limited in transmitting a large volume of data at an ultra-high speed because a circuit acting as a transmission medium is made of a conductive metal such as copper. To avoid the above limit, an optical PCB is developed, in which a waveguide with a predetermined size is directly formed on a silicone substrate and the resulting silicone substrate is embedded in a PCB.

In other words, the optical PCB includes the waveguide made of a polymer or a glass fiber embedded therein to transmit and receive a beam acting as a signal therethrough unlike a conventional PCB in which a copper plate is patterned to form an inner layer and an outer layer thereof.

In the optical PCB, an electrical and an optical signal are all used, and the ultra-high data communication is interfaced by the optical signal. Additionally, a copper circuit pattern is formed in an element to convert the optical signal into the electrical signal to store data and to treat the electrical signal, and a glass plate as well as the waveguide is embedded in the optical PCB.

However, in case that the waveguide is formed on the silicone substrate and the resulting silicone substrate is embedded in the PCB to form the optical PCB, the waveguide for a large area cannot be formed and it is difficult to conduct the application through the formation of the circuit due to a size of the silicone substrate of 8 to 12 inches.

Further, in the above case, it is impossible to form various shapes of waveguides in the PCB.

Meanwhile, the optical PCB may be applied to a switch and a transceiver of a communication net, a switch and a server of a data communication, a communication device of the aerospace industry and an avionics, a base station of a mobile telephone of a universal mobile telecommunications system (UMTS), or a backplane and a daughter board used in a mainframe/supercomputer.

Additionally, the rapid increase of use of the Internet and the improvement of the service quality on the Internet led to the increase in a quantity of data treated and transmitted, thus the optical PCB acting as a medium capable of conducting an optical-interfacing is developed to extend a bandwidth and increase a treating speed of the signal. In other words, in the conventional PCB, the optical-interfacing without being affected by the EMS (electro magnetic susceptibility) characteristic is needed because the electrical signal is limited by the EMS characteristic during a high-speed switching at a GHz range of the bandwidth.

However, even though ten years have passed since the optical PCB was developed, a first and a second EOCB (electrical-optical printed circuit board) technology in which a backplane treats a signal in a point-to-point manner against a glass fiber, and a third EOCB technology of an optical signal interfacing using a multi channel manner in which a large quantity of data is simultaneously treated are developed, but a method of producing a multi-layered optical PCB is not yet suggested, in which an element, a waveguide acting as a medium, and a glass fiber are embedded in a PCB.

SUMMARY OF THE INVENTION

Accordingly, the present invention has been made keeping in mind the above problems occurring in the prior art, and an aspect of the present invention is to provide a PCB in which various shapes of waveguides for a large surface are embedded, and a method of producing the same, in which a core layer cured by UV and a clad layer are coated on the PCB and the core layer is then exposed using an exposing film on which a waveguide pattern is formed.

It is another aspect of the present invention to provide a multi-layered PCB including a waveguide embedded therein and a method of producing the same, in which a prepreg is interposed between the waveguide-embedded PCBs to conduct a lay-up of the PCB and a viahole is then formed and copperplated to electrically connect layers constituting the resulting PCB to each other.

Additional aspects and/or advantages of the invention will be set forth in part in the description which follows and, in part, will be obvious from the description, or may be learned by practice of the invention.

The above and/or other aspects are achieved by providing a PCB in which a waveguide is embedded, including a substrate, and a lower clad layer formed on the substrate through a predetermined process to allow an optical signal irradiated thereto to be total-reflected thereby. A core layer is formed on the lower clad layer through a predetermined process and exposed using an exposing film on which a waveguide pattern is formed to form the waveguide with a predetermined shape therefrom. Furthermore, an upper clad layer is formed on the core layer through a predetermined process to allow the optical signal irradiated thereto to be total-reflected thereby.

Additionally, the above and/or other aspects are achieved by providing a multi-layered PCB in which the waveguide is embedded. In this regard, the multi-layered PCB is produced by interposing a prepreg between PCBs in which the waveguides are formed to conduct a layup of the PCB, forming via holes to connect layers constituting the resulting PCB to each other, and copperplating the via holes to form copperplated layers to electrically connect the layers constituting the resulting PCB to each other.

Moreover, the above and/or other aspects are achieved by providing a method of producing a PCB in which a waveguide is embedded. At this time, the method includes a first step of forming a circuit pattern and a target image for alignment on a substrate, a second step of forming a lower clad layer on the substrate on which the circuit pattern and target image for alignment are formed, a third step of forming a core layer from which the waveguide with a predetermined shape is to be formed on the lower clad layer, a fourth step of aligning an exposing film on which a waveguide pattern with a predetermined shape is formed on the core layer using the target image formed on the substrate, a fifth step of exposing the core layer by UV using the exposing film on which the waveguide pattern is formed to form the waveguide for a large area on the lower clad layer, and a sixth step of forming an upper clad layer on the core layer from which the waveguide is formed.

Further, the above and/or other aspects are achieved by providing a method of producing a PCB in which a waveguide is embedded. At this time, the method includes a first step of forming a circuit pattern and a target image for alignment on a substrate, a second step of forming a lower clad layer on the substrate on which the circuit pattern and target image for alignment are formed, a third step of forming a core layer from which the waveguide with a predetermined shape is to be formed on the lower clad layer, a fourth step of aligning an exposing film on which a waveguide pattern with a predetermined shape is formed on the core layer using the target image formed on the substrate, a fifth step of exposing the core layer by UV using the exposing film on which the waveguide pattern is formed to form the waveguide for a large area on the lower clad layer, a sixth step of forming an upper clad layer on the core layer from which the waveguide is formed, a seventh step of laminating the PCBs including the waveguides with a prepreg interposed therebetween, and a eighth step of forming through holes of which surfaces are plated with copper, through the PCBs to electrically connect layers constituting the PCBs to each other.

BRIEF DESCRIPTION OF THE DRAWINGS

This and other aspects and advantages of the invention will become apparent and more readily appreciated from the following description of the preferred embodiments, taken in conjunction with the accompanying drawing of which.

DETAILED DESCRIPTION OF THE PREFERRED EMBODIMENTS

Reference will now be made in detail to the present preferred embodiments of the present invention, examples of which are illustrated in the accompanying drawing.

Figure 1:
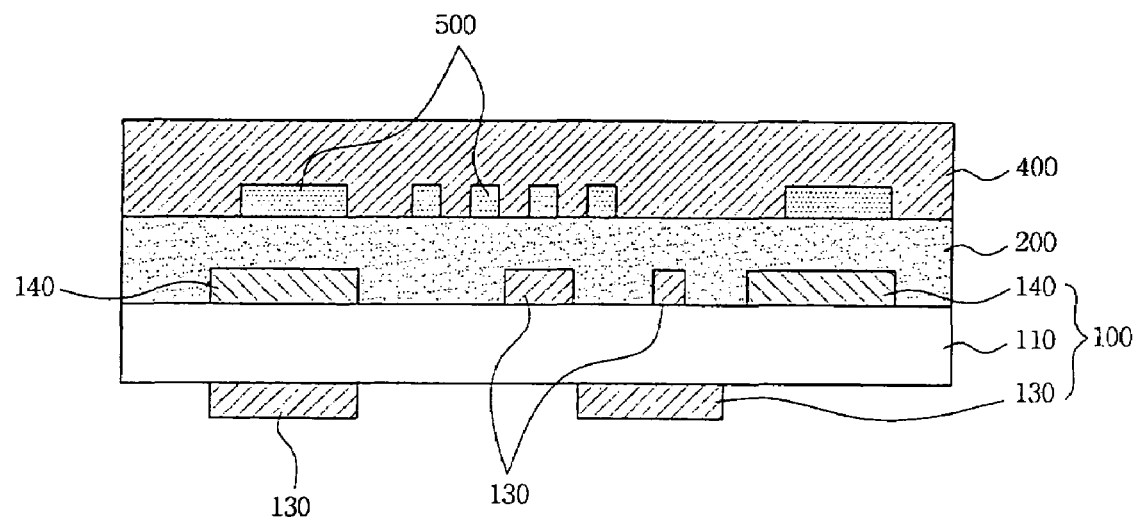
FIG. 1 is a sectional view of a PCB including a waveguide according to the first embodiment of the present invention.

According to the first embodiment of the present invention, as shown in FIG. 1, a PCB of the present invention, in which a waveguide with a predetermined shape for a large area is embedded, includes a substrate 100, a lower clad layer 200, the waveguide 500, and an upper clad layer 400.

At this time, a core layer 300 as will be described later is exposed by UV using an exposing film 800 on which a waveguide pattern is formed to form the waveguide 500 corresponding in shape to the waveguide pattern of the exposing film 800 therein.

A copper clad laminate (CCL) may be used as the substrate 100, which consists of a dielectric layer 110 made of a dielectric material such as epoxy, and copper clads 120 formed on an upper and a lower side of the dielectric layer 110 using a press and patterned to form a circuit pattern 130 and a target image 140 for alignment.

Alternatively, a resin-coated copper (RCC) may be used as the substrate 100, which consists of a dielectric layer 110 made of a dielectric material such as epoxy, and a copper clad 120 formed on any one side of an upper and a lower side of the dielectric layer 110 using a press and patterned to form a circuit pattern 130 and a target image 140 for alignment.

The target image 140 functions to correspondingly align a position of the waveguide 500 formed in the core layer 300 to a position of the exposing film 800 including the waveguide pattern used to form the waveguide 500.

The lower clad layer 200 is formed on the substrate 100 on which the circuit pattern 130 and target image 140 are formed through a coating and a drying step according to a predetermined process, in detail, a lamination, a rolling, or a squeeze printing process, and has slightly smaller refractivity than the core layer 300 to prevent light irradiated to the core layer 300 from streaming outside of the core layer 300.

At this time, a liquid-type clad with a polymer structure is coated and dried on the substrate 100 according to the rolling, lamination, screen, or spray process to form the lower clad layer 200 on the substrate 100.

The rolling process includes coating the clad supplied from a vessel containing a photo-reactive liquid polymer by a pump on the substrate using a roller while the substrate on which the circuit pattern and target image for alignment are formed is moved using a predetermined moving unit.

Additionally, in the case of the lamination process, the clad supplied from a tub-type roll wound by a clad material is coated on the substrate using a roller to form the clad layer on the substrate when the substrate on which the circuit pattern and target image for alignment are formed is moved using a predetermined moving unit.

Furthermore, according to the screen printing process, the clad material is coated using a screen printing plate on the substrate on which the circuit pattern and target image for alignment are formed to form the lower clad layer on the substrate. In detail, the screen printing plate is mounted on the substrate to print various patterns including a corrosion resist, a solder resist, and a symbol mark, as well as a wire pattern on the substrate. Clad and core forming materials are then coated on the substrate using a squeeze to form the lower and upper clad layer, and the core layer on the substrate.

As for the spray process, the clad and core forming materials are sprayed on the substrate on which the circuit pattern and target image for alignment are formed to form the lower and upper clad layer, and the core layer on the substrate.

The core layer 300 is formed on the lower clad layer 200 according to a predetermined process, in detail, the lamination, rolling, or squeeze printing process, and has a higher refractivity than the lower clad layer 200 to allow the optical signal irradiated through one end of the waveguide 500 to cause a total-reflection at interfaces of the core layer 300, lower clad layer 200, and upper clad layer 400, thereby transmitting the optical signal through the core layer 300 into another end of the waveguide 500.

Additionally, a liquid polymer, 97% or more transparent, cured by the UV is coated on the lower clad layer 200 according to the lamination, rolling, or squeeze printing process to form the core layer 300 on the lower clad layer 200.

Furthermore, when the core layer 300 is exposed to the UV through the exposing film 800 on which the waveguide pattern corresponding in position to the target image 140 formed on the substrate 100 is formed, various shapes of waveguides 500 are formed along the waveguide pattern formed on the exposing film 800.

The upper clad layer 400 is formed on the core layer 300 in which the waveguide 500 with a predetermined shape is formed through a coating and a drying step according to a predetermined process, in detail, the lamination, rolling, or squeeze printing process, and has the slightly smaller refractivity than the core layer 300 to prevent light irradiated to the core layer 300 from streaming outside of the core layer 300.

At this time, a liquid-type clad with a polymer structure is coated on the core layer 300 in which the waveguide 500 is formed according to the lamination, rolling, and squeeze printing process to form the upper clad layer 400 on the core layer 300.

Figure 2:
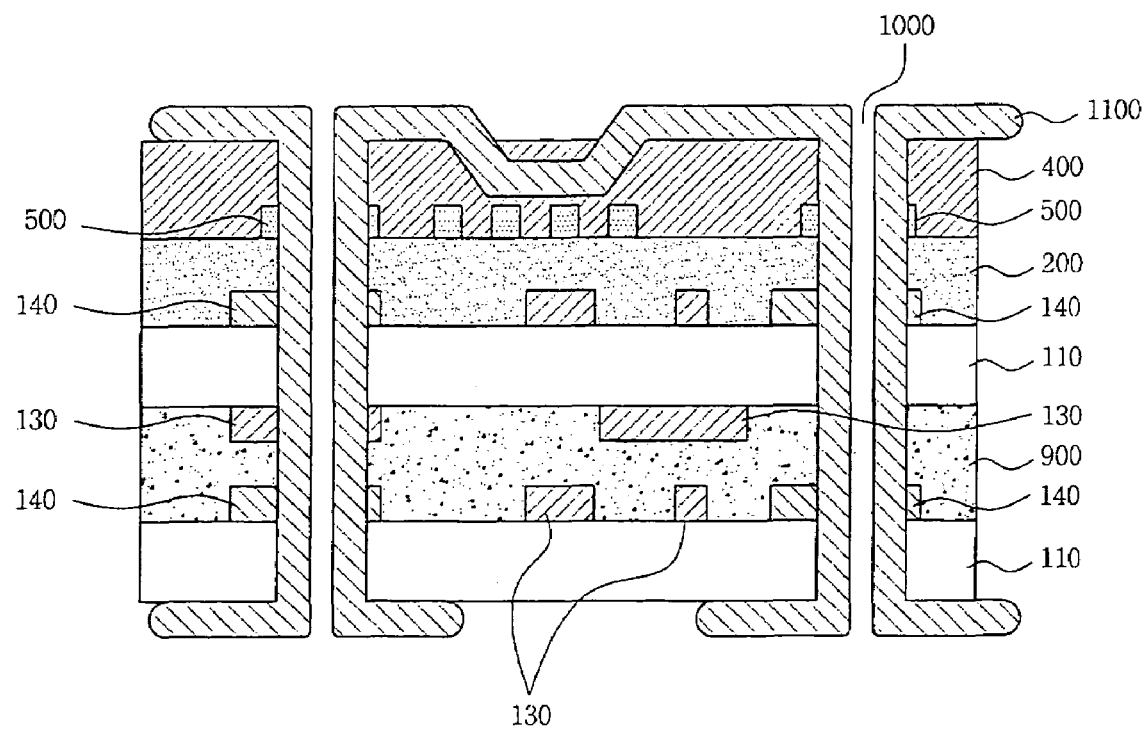
FIG. 2 is a sectional view of a PCB including a waveguide according to the second embodiment of the present invention.

According to the second embodiment of present invention, a method of producing a multi-layered PCB in which the waveguide is embedded, includes interposing a prepreg 900 between PCBs in which the waveguides are formed to conduct a layup of the PCB as shown in FIG. 2, forming via holes 1000 to connect layers constituting the resulting PCB to each other, and copperplating the via holes 1000 to form copper-plated layers 1100 to electrically connect the layers constituting the resulting PCB to each other.

Hereinafter, a detailed description will be given of the production of the PCB in which the waveguide for a large area is embedded according to the present invention, referring to FIGS. 3 to 5.

Figure 3:
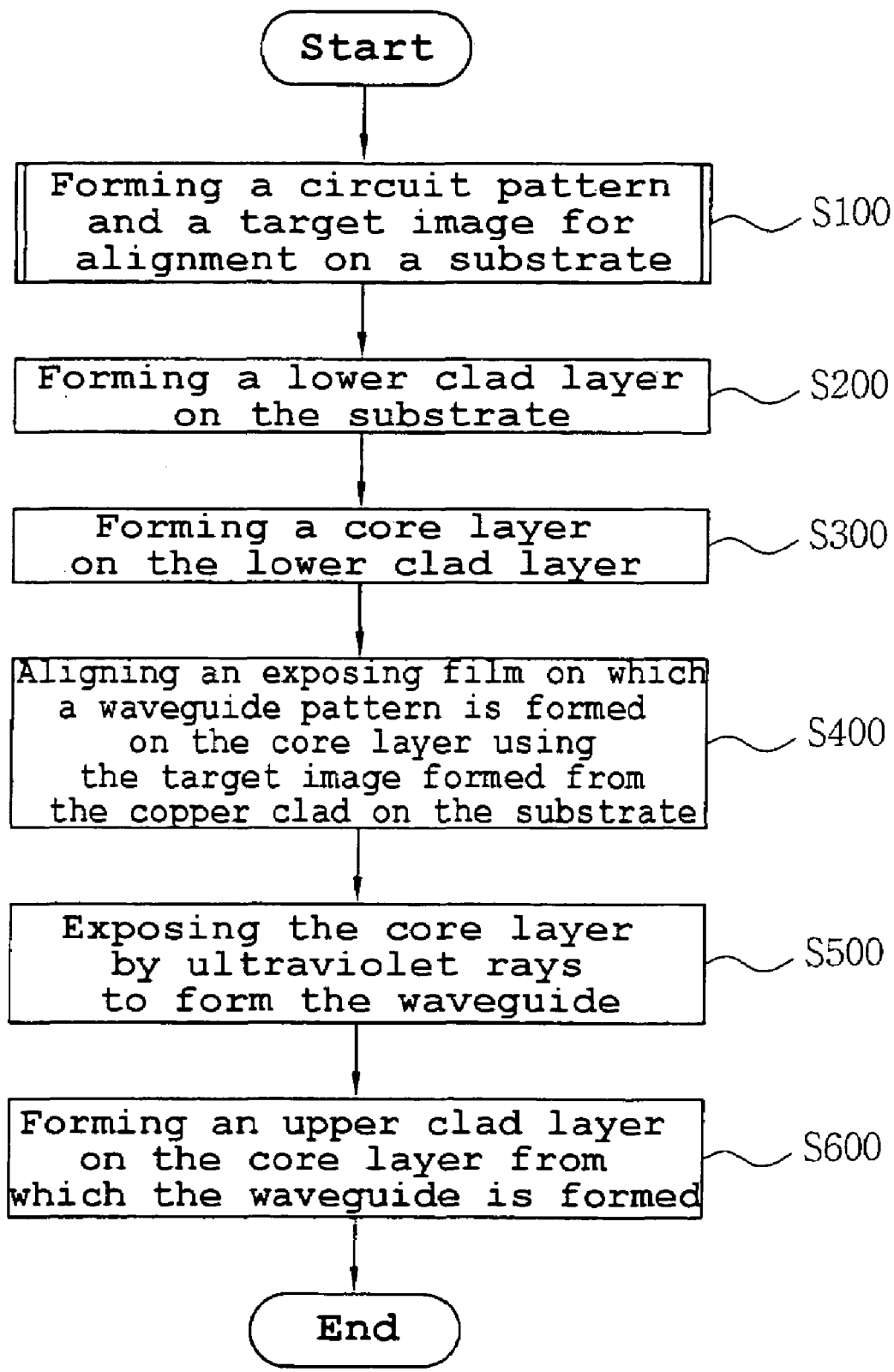
FIG. 3 is a flow chart showing the production of a PCB including a waveguide according to the present invention.
Figure 4:
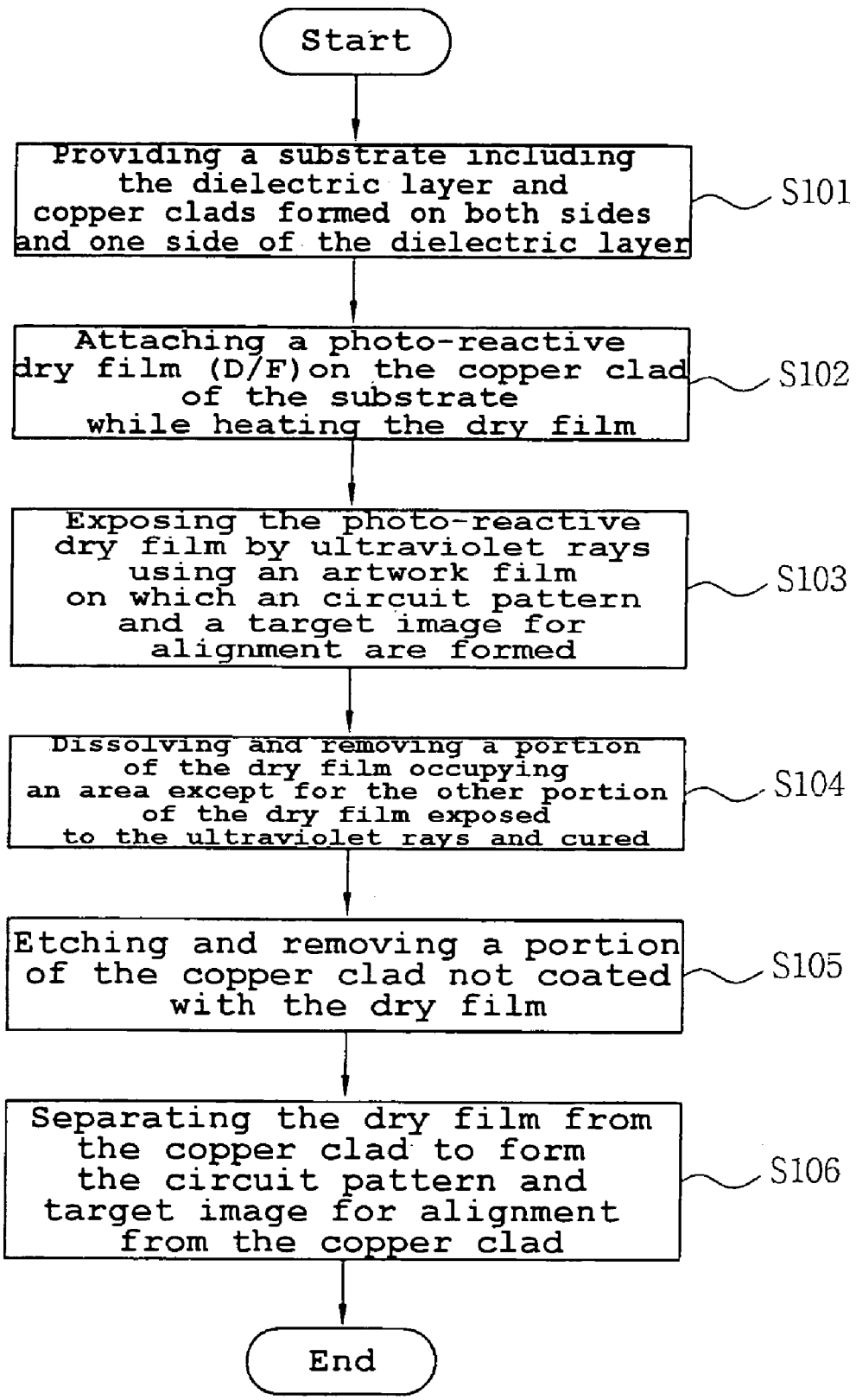
FIG. 4 is a flow chart showing the formation of a circuit pattern and a target image for alignment on the PCB according to the present invention.

FIG. 3 is a flow chart showing the production of a PCB including a waveguide according to the present invention, FIG. 4 is a flow chart showing the formation of a circuit pattern and a target image for alignment on the PCB according to the present invention, and FIGS. 5A to 5M are sectional views illustrating the production of the PCB including the waveguide according to the present invention.

Referring to FIG. 3, a circuit pattern and a target image for alignment are formed on a substrate 100 in operation 100.

In FIGS. 5A to 5M, there is illustrated a procedure of forming the circuit pattern 130 and target image 140 for alignment on a copper clad 120 of the substrate 100.

Figure 5A:
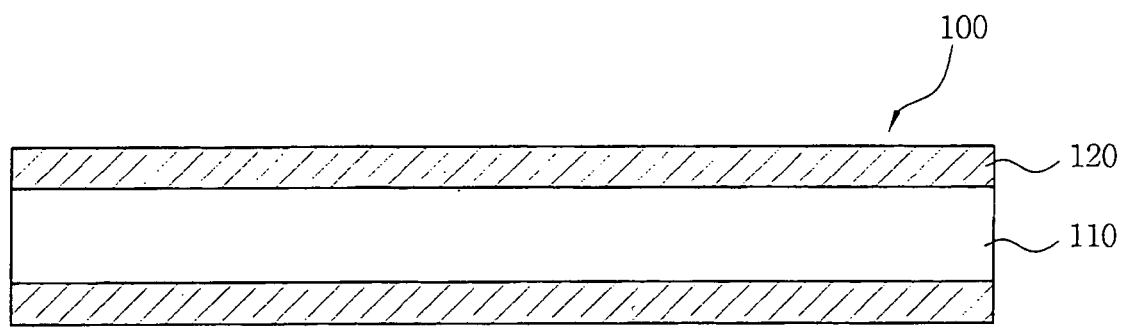
FIGS. 5A to 5M are sectional views illustrating the production of the PCB including the waveguide according to the present invention.

With reference to FIGS. 4 and 5A, a copper clad laminate or a resin-coated copper (not shown) including a dielectric layer 110 and a copper clad 120 formed on an upper and a lower side thereof or on any one side of the upper and lower side thereof is used as the substrate 100 in operation 101.

Figure 5B:
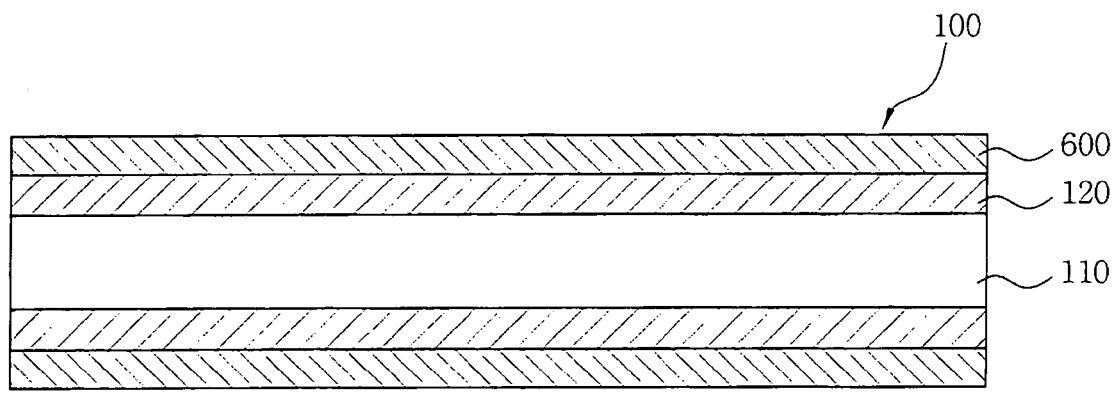
Figure 5C:
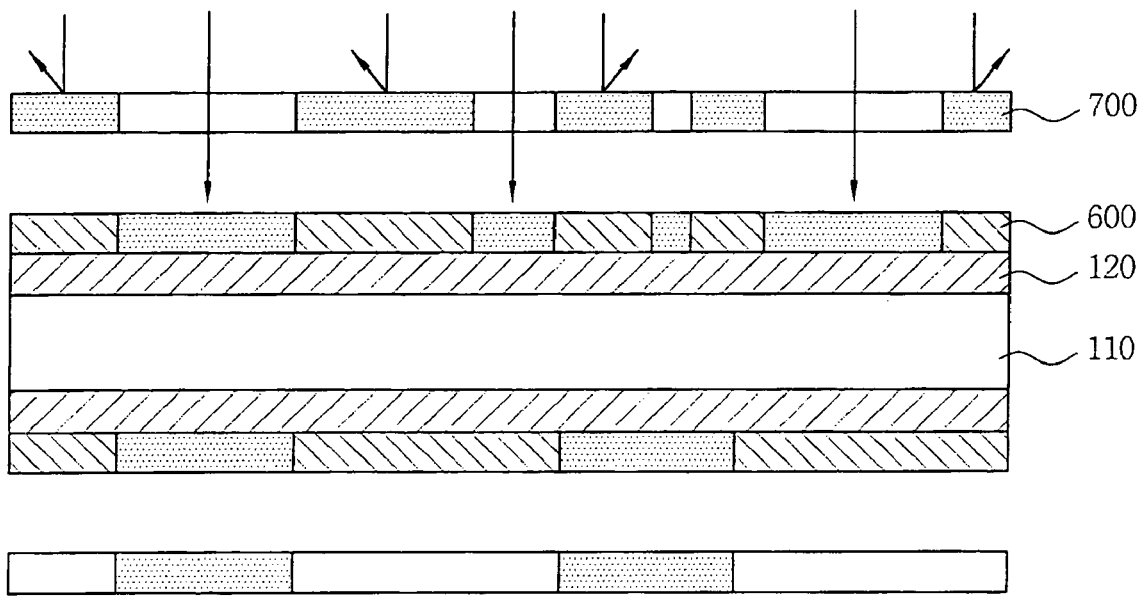
Figure 5D:
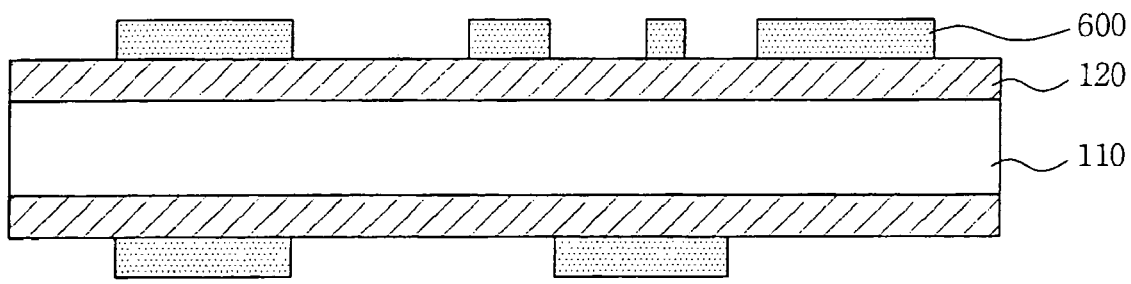
Figure 5E:
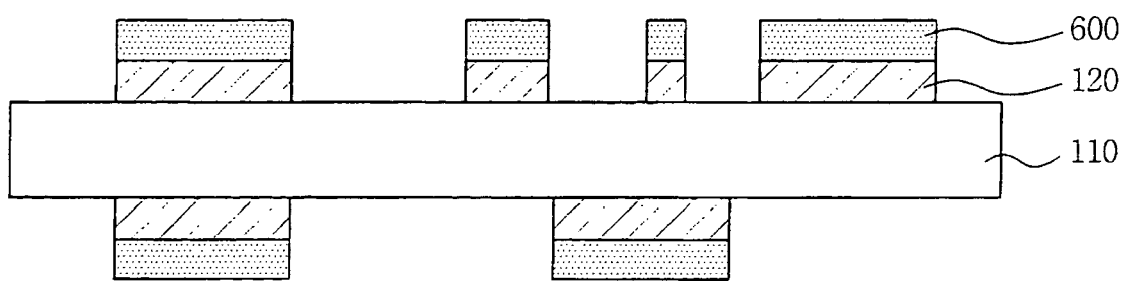
Figure 5F:
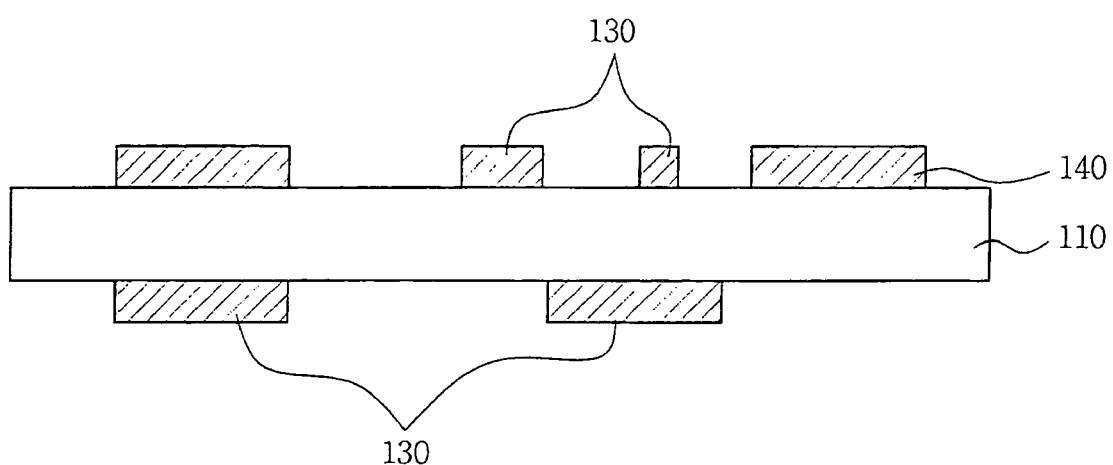

Referring to FIG. 5B, a dry film (D/F) 600 is layered on the copper clad 120 of the copper clad laminate or resin-coated copper 100 to transcribe the circuit pattern 130 and target image 140 for alignment of FIG. 5F on the copper clad 102 in operation 102.

Turning to FIG. 5C, after the dry film (D/F) 600 is layered on the copper clad 120, the dry film 600 is exposed by UV using an artwork film 700 from which the circuit pattern and target image for alignment are formed in operation 103.

As shown in FIG. 5D, a portion of the dry film 600 is dissolved and removed, which occupies an area except for the other portion of the dry film 600 exposed to the UV to be cured in operation 104.

Referring to FIG. 5E, the copper clad 120 is subjected to an etching process in operation 105. At this time, a portion of the copper clad 120 is coated with a portion of the dry film 600 not removed.

In FIG. 5F, after a portion of the copper clad 120 not coated with a portion of the dry film 600 cured by the UV is etched and removed, the dry film 600 is separated from the copper clad 120 to construct the circuit pattern 130 and target image 140 for alignment having a predetermined shape on the copper clad laminate or resin-coated copper 100 in operation 106.

The lower clad layer is then formed on the substrate 100 as a means to cover the circuit pattern and target image for alignment in operation 200.

Figure 5G:
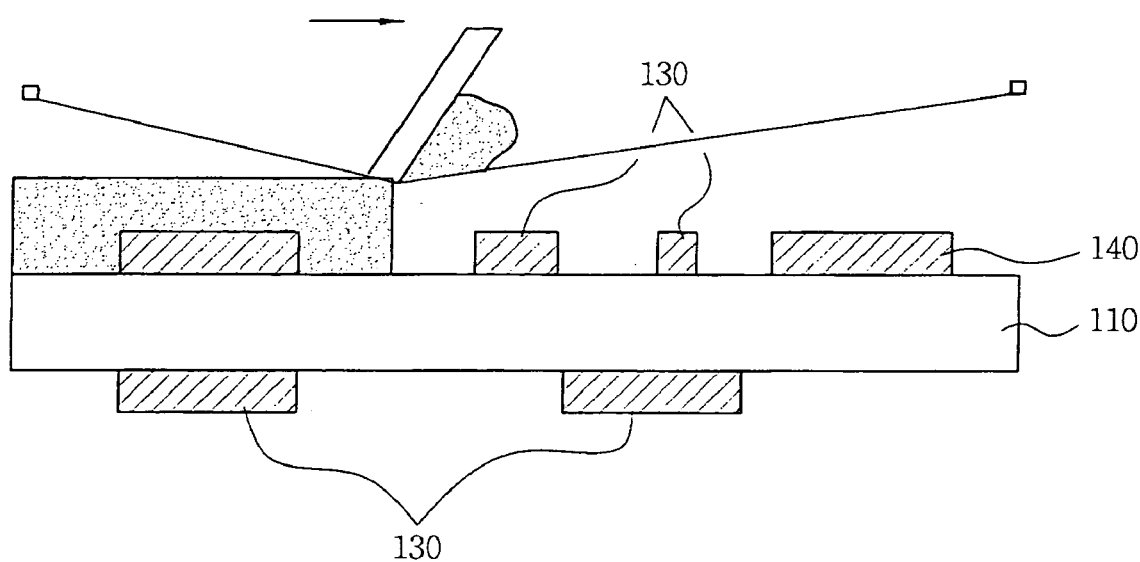

In other words, as shown in FIG. 5G, a clad material is coated on the circuit pattern 130 and target image 140 for alignment on the substrate 100 according to a predetermined process, for example, the lamination, rolling, screen printing, or spray process.

Figure 5H:
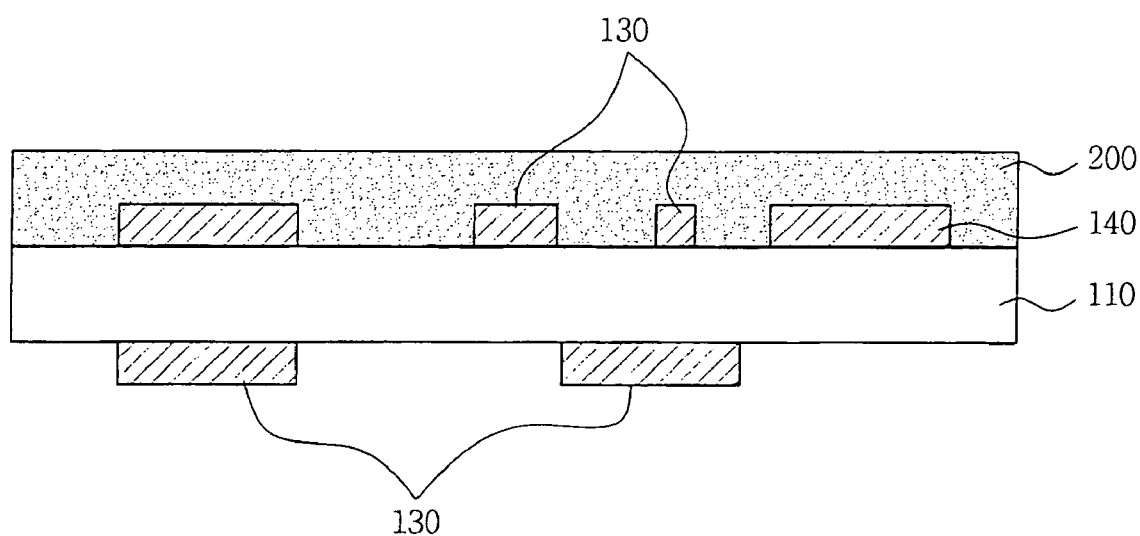

In FIG. 5H, the clad material coated on the circuit pattern 130 and target image 140 for alignment on the substrate 100 is dried and cured at predetermined temperatures to form the lower clad layer 200 on the substrate 100.

That is to say, a liquid clad material with a polymer structure is coated on the substrate 100 and dried according to the lamination, rolling, screen printing, and spray process to form the lower clad layer 200 on the substrate 100.

In this regard, the lower clad layer 200 has slightly lower refractivity than the core layer 300 through which an optical signal passes to prevent light irradiated to the core layer 300 from streaming outside of the core layer 300.

After the lower clad layer 200 is formed on the circuit pattern 130 and target image 140 on the substrate 100, the core layer 300 is formed on the lower clad layer 200 to form the waveguide with a predetermined shape therein in operation 300.

Figure 5I:
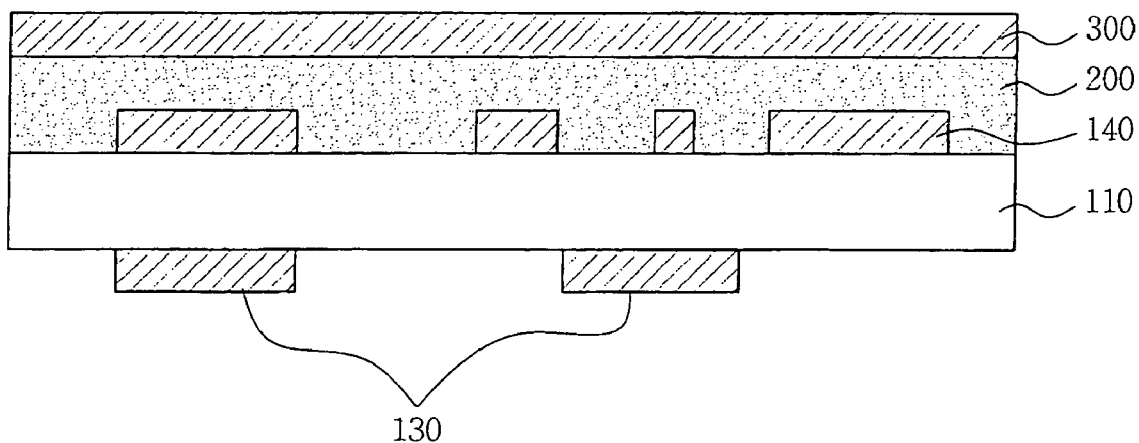

In detail, a predetermined core material is attached and coated on the lower clad layer 200 according to a predetermined process, for example, any one process of the lamination, rolling, screen printing, and spray process to form the core layer 300 on the lower clad layer 200 as shown in FIG. 5I.

At this time, a liquid polymer, 97% or more transparent, cured by the UV is coated on the lower clad layer 200 according to the lamination, rolling, screen printing, or spray process to form the core layer 300 on the lower clad layer 200.

Furthermore, the core layer 300 has the higher refractivity than the lower clad layer 200 to allow the optical signal irradiated through one end of the waveguide 500 to cause a total-reflection at interfaces of the core layer 300 and lower clad layer 200, thereby transmitting the optical signal through the core layer 300 into another end of the waveguide 500.

Figure 5J:
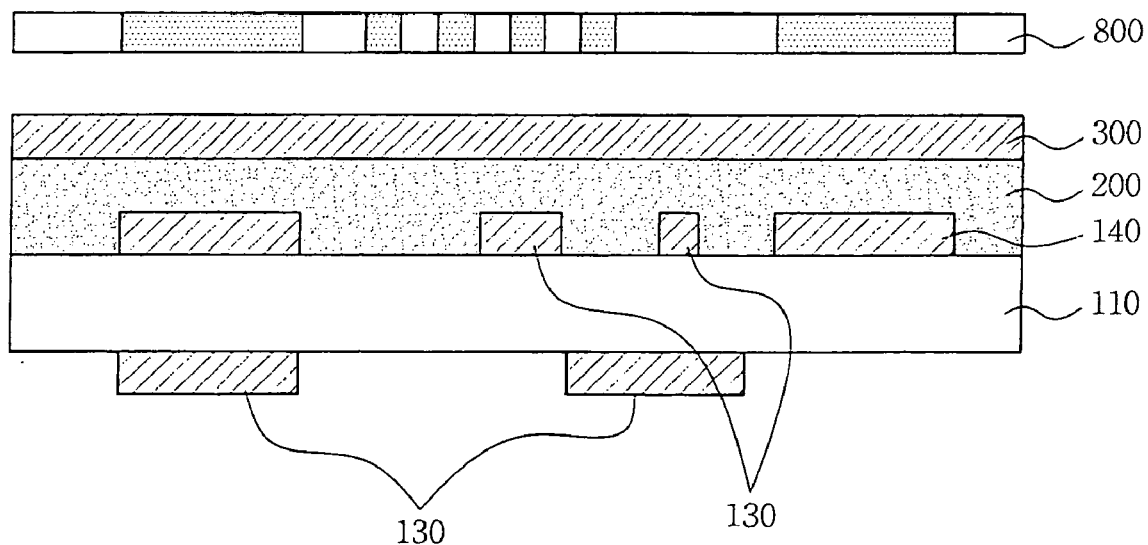

As shown in FIG. 5J, after the core layer 300 is formed on the lower clad layer 200, the exposing film 800 on which the waveguide pattern with a predetermined shape is formed is aligned on the core layer 300 so that the exposing film 800 corresponds in a position to the target image 140 formed in the copper clad 120 on the substrate 100 in operation 400.

Figure 5K:
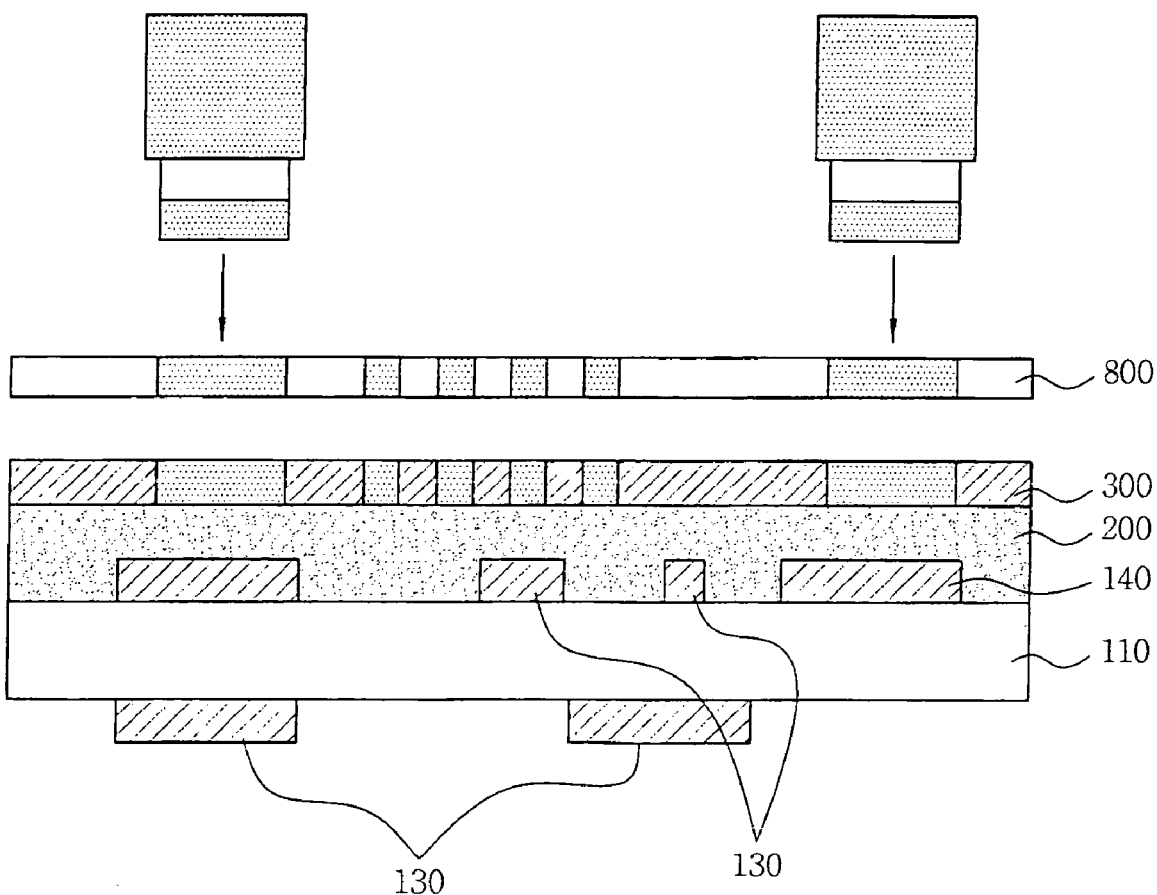

Turning to FIG. 5K, the core layer 300 is exposed by the UV using the exposing film 800 on which the waveguide pattern is formed in operation 500.

Figure 5L:
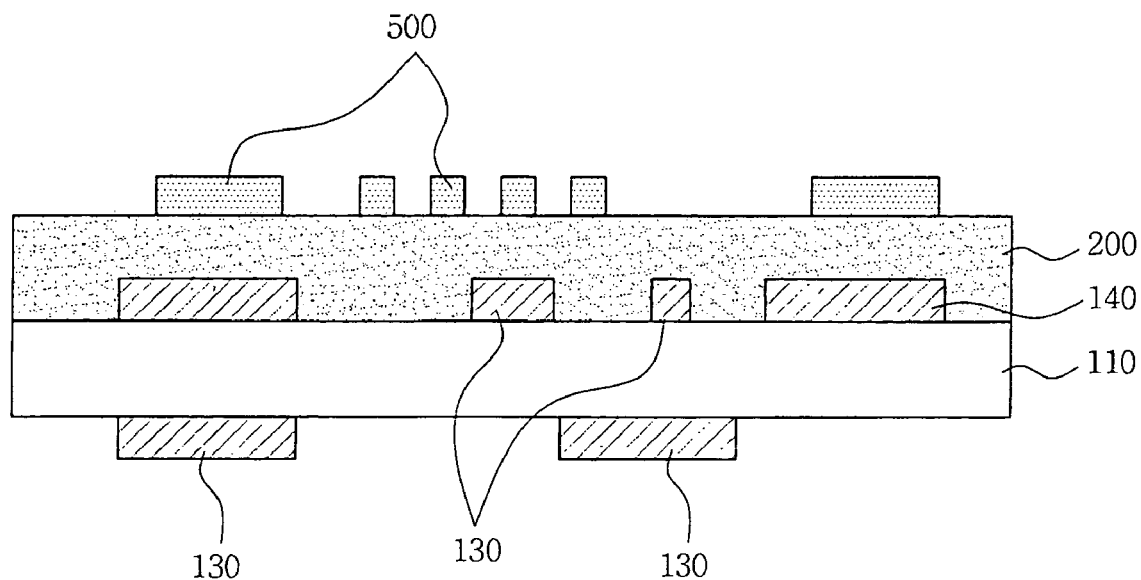

At this time, as shown in FIG. 5L, a portion of the core layer 300 which occupies an area except for the other portion of the core layer 300 cured by the UV passing through the exposing film 800 is removed to form the waveguide 500 having the corresponding shape to the waveguide pattern formed on the exposing film 800.

Figure 5M:
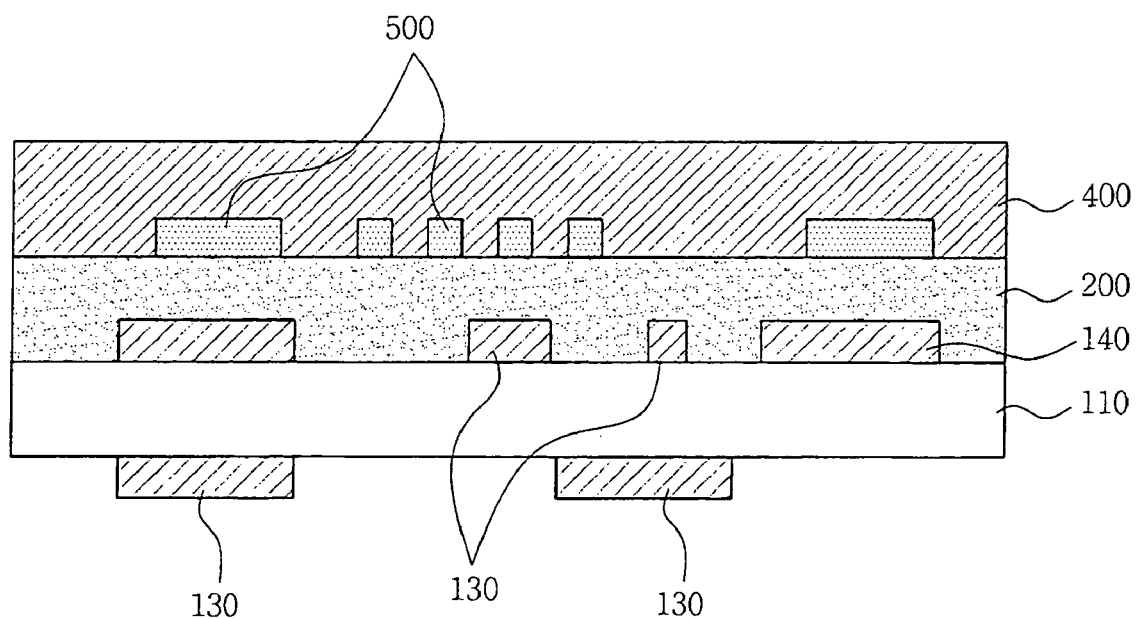

Referring to FIG. 5M, after the core layer 300 is exposed by the UV to form the waveguide 500 with a predetermined shape, an upper clad layer 400 is formed on the core layer 300 in which the waveguide 500 is formed in operation 600.

In this regard, the clad material is coated on the core layer 300 in which the waveguide 500 with a predetermined shape is formed according to a predetermined process, for example, any one process of the lamination, rolling, and squeeze printing process, and dried at predetermined temperatures to form the upper clad layer 400 with the predetermined refractivity on the core layer 300, thereby accomplishing the PCB in which the waveguide is embedded.

At this time, the upper clad layer 400 has the slightly smaller refractivity than the core layer 300 through which the optical signal passes to prevent light irradiated to the core layer 300 from streaming outside of the core layer 300.

Furthermore, a method of producing the PCB in which the waveguide 500 is embedded according to the present invention, further includes interposing a prepreg 900 between the PCBs having the waveguides 500, and forming through holes 1000 of which surfaces are plated with copper to electrically connect layers constituting the PCB to each other.

As apparent from the above description, the present invention provides a PCB in which waveguides with various shapes for a large area are embedded, and a method of producing the PCB. In this regard, the method includes forming a core layer cured by UV and a clad layer on the PCB in which a circuit pattern is formed, and exposing the core layer by the UV using an exposing film on which a waveguide pattern with a predetermined shape is formed.

Additionally, the present invention provides a method of producing a multi-layered PCB in which a waveguide is embedded, including interposing a prepreg between PCBs on which the waveguides are formed to conduct a layup of the substrate, forming via holes to connect layers constituting the resulting substrate to each other, and copperplating the via holes to form copperplated layers to electrically connect the layers constituting the substrate to each other.

Furthermore, the present invention is advantageous in that a target image for alignment on the substrate serves to correspondingly align positions of the waveguide formed in the core layer and a film on which the waveguide pattern is formed.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A printed circuit board in which a waveguide is embedded, comprising:
   a substrate on which a circuit pattern and a target image each having a predetermined shape are formed;
   a lower clad layer formed on the substrate, said circuit pattern, and said target image through a predetermined process to allow an optical signal irradiated thereto to be total-reflected thereby;
   a core layer formed on the lower clad layer through a predetermined process and exposed using an exposing film on which a waveguide pattern is formed to form to define the waveguide with a predetermined shape for a large area therefrom; and
   an upper clad layer formed on the core layer through a predetermined process to allow the optical signal irradiated thereto through said waveguide to be total-reflected thereby;
   wherein the substrate comprises a copper clad laminate (CCL) including a dielectric layer and copper clads formed on an upper and a lower side of the dielectric layer using a press, the copper clads being patterned to form the circuit pattern and target image each having the predetermined shape therefrom.

2. The printed circuit board as set forth in claim 1, wherein the lower clad layer is formed on the substrate through any one process of a lamination, a rolling, a screen printing, and a spray process.

3. The printed circuit board as set forth in claim 1, wherein the core layer is formed on the lower clad layer through any one process of a lamination, a rolling, a screen printing, and a spray process.

4. The printed circuit board as set forth in claim 1, wherein the upper clad layer is formed on the core layer from which the waveguide is formed through any one process of a lamination, a rolling, a screen printing, and a spray process.

5. The printed circuit board as set forth in claim 1, wherein a polymer-type clad is coated on the substrate and core layer, and dried to form the lower and upper clad layer on the substrate and core layer.

6. The printed circuit board as set forth in claim 1, wherein a polymer-type core material, 97% or more transparent, cured by UV is coated on the lower clad layer to form the core layer on the lower clad layer.

7. A printed circuit board in which a waveguide is embedded, comprising:
   a substrate on which a circuit pattern and a target image each having a predetermined shape are formed;
   a lower clad layer formed on the substrate, said circuit pattern, and said target image through a predetermined process to allow an optical signal irradiated thereto to be total-reflected thereby;
   a core layer formed on the lower clad layer through a predetermined process and exposed using an exposing film on which a waveguide pattern is formed to form to define the waveguide with a predetermined shape for a large area therefrom; and
   an upper clad layer formed on the core layer through a predetermined process to allow the optical signal irradiated thereto through said waveguide to be total-reflected thereby;
   wherein the substrate comprises a resin-coated copper (RCC) including a dielectric layer and a copper clad formed on any one side of an upper and a lower side of the dielectric layer using a press, the copper clad being patterned to form the circuit pattern and target image each having the predetermined shape therefrom.

8. The printed circuit board as set forth in claims 1 or 7, wherein the target image formed on the substrate correspondingly aligns a position of the waveguide formed on the core layer to a position of the exposing film on which the waveguide pattern is formed.

9. A printed circuit board in which a waveguide is embedded, comprising:
   a substrate on which a circuit pattern and a target image each having a predetermined shape are formed;
   a lower clad layer formed on the substrate, said circuit pattern and said target image to allow an optical signal irradiated thereto to be total-reflected thereby;
   a core layer formed on the lower clad layer and exposed using an exposing film on which a waveguide pattern is formed to form the waveguide with a predetermined shape; and
   an upper clad layer formed on the core layer to allow the optical signal through said waveguide to be total-reflected thereby;
   wherein the substrate comprises a copper clad laminate (CCL) including a dielectric layer and copper clads formed on an upper and a lower side of the dielectric layer using a press, the copper clads being patterned to form the circuit pattern and target image.

10. A printed circuit board comprising:
    a substrate having a top surface with a circuit pattern formed of an electrically conductive material;
    a lower clad layer formed on and contacting said top surface and said circuit pattern, said lower clad layer being made of a first light conducting material having a first refractivity;
    a waveguide formed on said lower clad layer and made of a second light conducting material having a second refractivity that is higher than said first refractivity to confine light being transmitted through said waveguide; and
    an upper clad layer formed on said waveguide and said first lower clad layer, said upper clad layer and said lower clad layer cooperating to surround said waveguide,
    wherein said substrate is provided on its upper surface with a target image for said waveguide, said target image is made of the same electrically conductive material as said circuit pattern;
    wherein the substrate comprises a copper clad laminate (CCL) including a dielectric layer and copper clads formed on an upper and a lower side of the dielectric layer using a press, the copper clads being patterned to form the circuit pattern.

11. The printed circuit board of claim 10 wherein said upper clad layer is made of a material having a smaller refractivity then said waveguide, said upper and lower clad layers cooperating to totally reflect light into said waveguide.

12. The printed circuit board of claim 10 wherein said substrate has a bottom surface with another circuit pattern.

* * * * *